(12) United States Patent
Scheuermann et al.

(10) Patent No.: US 10,903,437 B2
(45) Date of Patent: Jan. 26, 2021

(54) FABRICATION METHOD FOR FUSED MULTI-LAYER AMORPHOUS SELENIUM SENSOR

(71) Applicant: The Research Foundation for The State University of New York, Albany, NY (US)

(72) Inventors: James Scheuermann, Katonah, NY (US); Wei Zhao, East Setauket, NY (US)

(73) Assignee: The Research Foundation for The State University of New York, Albany, NY (US)

( * ) Notice: Subject to any disclaimer, the term of this patent is extended or adjusted under 35 U.S.C. 154(b) by 0 days.

(21) Appl. No.: 16/940,620

(22) Filed: Jul. 28, 2020

(65) Prior Publication Data

US 2020/0358017 A1    Nov. 12, 2020

Related U.S. Application Data

(63) Continuation of application No. 16/715,023, filed on Dec. 16, 2019, now Pat. No. 10,756,283, which is a
(Continued)

(51) Int. Cl.
*H01L 51/42*      (2006.01)
*G01T 1/20*       (2006.01)
(Continued)

(52) U.S. Cl.
CPC ........ *H01L 51/4213* (2013.01); *G01T 1/2018* (2013.01); *G01T 1/241* (2013.01);
(Continued)

(58) Field of Classification Search
CPC . H01L 51/4213; H01L 27/307; H01L 27/308; H01L 2031/0344; G01T 1/2018; G01T 1/241; G01T 1/247
See application file for complete search history.

(56) References Cited

U.S. PATENT DOCUMENTS 4,064,522 A    12/1977    Shaw et al.
4,343,881 A    8/1982     Sher et al.
(Continued)

OTHER PUBLICATIONS

Zhou J. et al., "Flexible Piezotronic Strain Sensor", Nano Letters 8(9):3035-3040 (2008).
(Continued)

*Primary Examiner* — Seahvosh Nikmanesh
(74) *Attorney, Agent, or Firm* — Scully, Scott, Murphy & Presser, P.C.

(57) ABSTRACT

A sensor including a layer of amorphous selenium (a-Se) and at least one charge blocking layer is formed by depositing the charge blocking layer over a substrate prior to depositing the amorphous selenium, enabling the charge blocking layer to be formed at elevated temperatures. Such a process is not limited by the crystallization temperature of a-Se, resulting in the formation of an efficient charge blocking layer, which enables improved signal amplification of the resulting device. The sensor can be fabricated by forming first and second amorphous selenium layers over separate substrates, and then fusing the a-Se layers at a relatively low temperature.

19 Claims, 6 Drawing Sheets

Related U.S. Application Data continuation of application No. 15/761,187, filed as application No. PCT/US2017/063857 on Nov. 30, 2017, now Pat. No. 10,547,015.

(60) Provisional application No. 62/429,101, filed on Dec. 2, 2016.

(51) Int. Cl.
 *G01T 1/24* (2006.01)
 *H01L 27/30* (2006.01)
 *H01L 31/0256* (2006.01)

(52) U.S. Cl.
 CPC ............ *G01T 1/247* (2013.01); *H01L 27/307* (2013.01); *H01L 27/308* (2013.01); *H01L 2031/0344* (2013.01)

(56) References Cited

U.S. PATENT DOCUMENTS

| | | | |
|---|---|---|---|
| 10,756,283 B2 * | 8/2020 | Scheuermann | ... H01L 27/14663 |
| 2007/0281226 A1 | 12/2007 | Aziz et al. | |
| 2009/0163014 A1 | 6/2009 | Lee et al. | |
| 2011/0163305 A1 | 7/2011 | Ogusu et al. | |
| 2014/0217284 A1 | 8/2014 | So et al. | |
| 2015/0171232 A1 | 6/2015 | Goldman et al. | |
| 2015/0268569 A1 | 9/2015 | Nukada et al. | |
| 2016/0111473 A1 | 4/2016 | Liu et al. | |
| 2017/0005274 A1 | 1/2017 | Kudo et al. | |
| 2017/0062733 A1 | 3/2017 | Yamaki et al. | |
| 2017/0069854 A1 | 3/2017 | Lee et al. | |
| 2017/0324045 A1 | 11/2017 | Takahashi et al. | |
| 2018/0093962 A1 | 4/2018 | Choi et al. | |
| 2018/0179206 A1 | 6/2018 | Haketa et al. | |
| 2018/0182978 A1 | 6/2018 | Yen et al. | |
| 2019/0051833 A1 | 2/2019 | Ishii et al. | |
| 2019/0051835 A1 | 2/2019 | Takahashi et al. | |
| 2019/0165286 A1 | 5/2019 | Li et al. | |
| 2019/0372040 A1 | 12/2019 | Scheuermann et al. | |

OTHER PUBLICATIONS

International Search Report and Written Opinion dated Feb. 27, 2018 received in International Application No. PCT/US2017/063857.

* cited by examiner

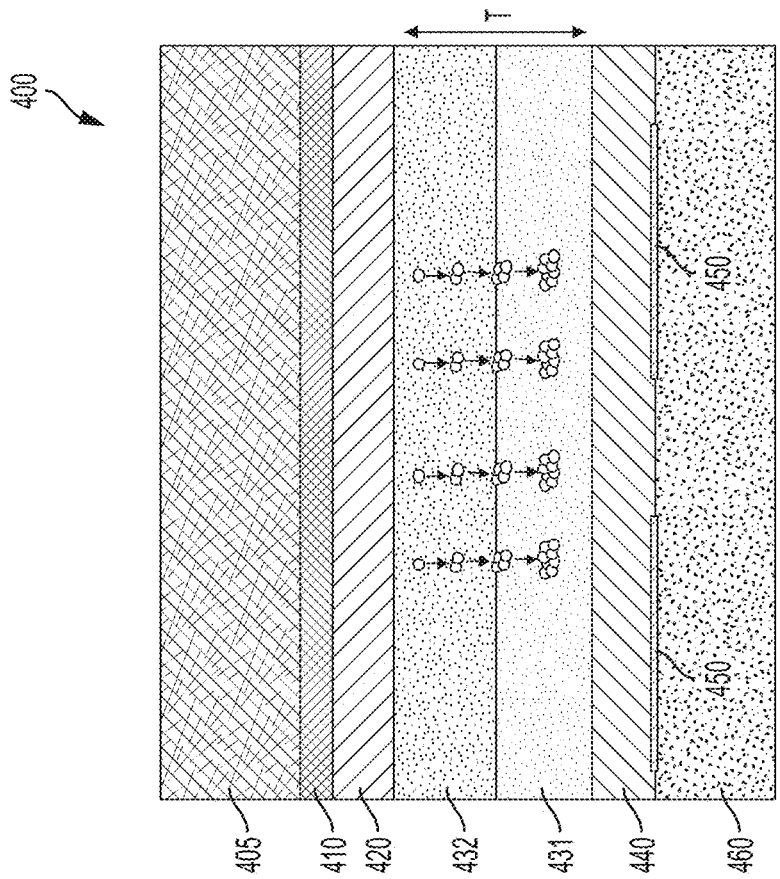
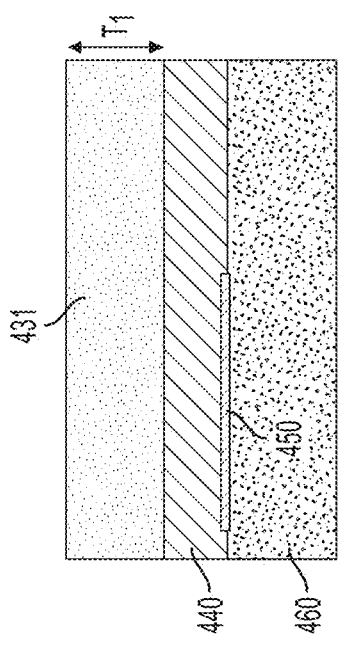
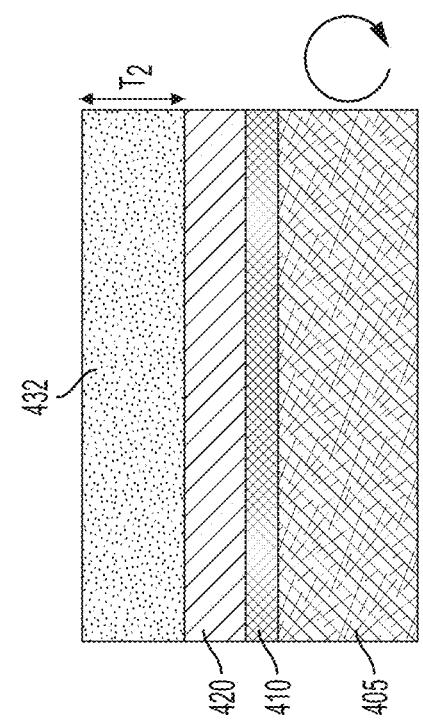

FABRICATION METHOD FOR FUSED MULTI-LAYER AMORPHOUS SELENIUM SENSOR

CROSS REFERENCE TO RELATED APPLICATIONS

The present application is a continuation of co-pending application having U.S. Ser. No. 16/715,023, filed on Dec. 16, 2019, which is a continuation of co-pending application having U.S. Ser. No. 15/761,187, filed on Mar. 19, 2018, now U.S. Pat. No. 10,547,015, which is a 371 of International Application having Serial No. PCT/US2017/063857, filed on Nov. 30, 2017, which claims the benefit of priority from U.S. Provisional Application No. 62/429,101, filed on Dec. 2, 2016, the content of which is incorporated herein by reference in its entirety.

GOVERNMENT LICENSE RIGHTS

This invention was made with government support under grant number EB002655 awarded by the National Institutes of Health. The government has certain rights in the invention.

BACKGROUND OF THE INVENTION

The present application relates generally to sensors adapted to detect optical or ionizing radiation, and more specifically to multi-layer amorphous selenium (a-Se) sensors and their methods of production.

Amorphous selenium (a-Se) has been commercialized both as an optical sensor and direct x-ray detector, and a-Se with avalanche gain has also been proposed for use in an indirect x-ray detector. Advantages of a-Se over other photoconductors such as silicon, which may be used in both optical and x-ray sensing applications, and CdTe, which may be used to detect x-rays, include the capability for large area deposition, avalanche multiplication of holes at electric fields (ESe) greater than 70 V/um, and monotonically increasing x-ray conversion gain with ESe.

As will be appreciated, conventional x-ray detectors, especially x-ray detectors adapted for low photon flux applications, suffer from image degradation due to electronic noise. However, decreasing the electronic noise of readout electronics increases the cost of the imager and has limited effect.

On the other hand, for a-Se detectors electronic noise can be overcome by increasing ESe to amplify the signal prior to the introduction of electronic noise. For optical sensors, ESe greater than 70 V/um is required for avalanche gain, while for direct x-ray sensors any increase in ESe will increase conversion gain.

SUMMARY OF THE INVENTION

Notwithstanding recent developments, there is a need for improved methods for fabricating a-Se-containing structures that can be incorporated into systems for optical and x-ray sensing where signal amplification can be realized prior to the introduction of electronic noise. As described herein, a-Se-containing structures may be made by delaying the formation of temperature-sensitive amorphous selenium layers until after the elevated temperature processing of charge blocking layers within the structures.

In accordance with various embodiments, a method of fabricating a sensor includes forming a first charge blocking layer over a first substrate, forming a first layer of amorphous selenium over the first charge blocking layer, forming a second charge blocking layer over a second substrate, and forming a second layer of amorphous selenium over the second charge blocking layer.

The first layer of amorphous selenium is then brought into contact with the second layer of amorphous selenium to form a multi-layer structure, which is heated to fuse the first layer of amorphous selenium to the second layer of amorphous selenium. Fusion may be accomplished by heating to above the glass transition temperature (Ts) of amorphous selenium, but below its crystallization temperature (T).

According to further embodiments, a sensor-forming method includes forming a charge blocking layer over a substrate, forming a layer of amorphous selenium over the charge blocking layer, and heating the layer of amorphous selenium to fuse the layer of amorphous selenium to the charge blocking layer.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 2A illustrates the sequential formation of a charge blocking layer and a first layer of amorphous selenium over a substrate including an electronic readout;

FIG. 2B illustrates the formation of a charge blocking layer and a second layer of amorphous selenium over a substrate;

FIG. 2C shows the formation of a multi-layer structure by the alignment and subsequent fusion of first and second layers of amorphous selenium according to various embodiments;

DETAILED DESCRIPTION OF THE INVENTION

Figure 1A:
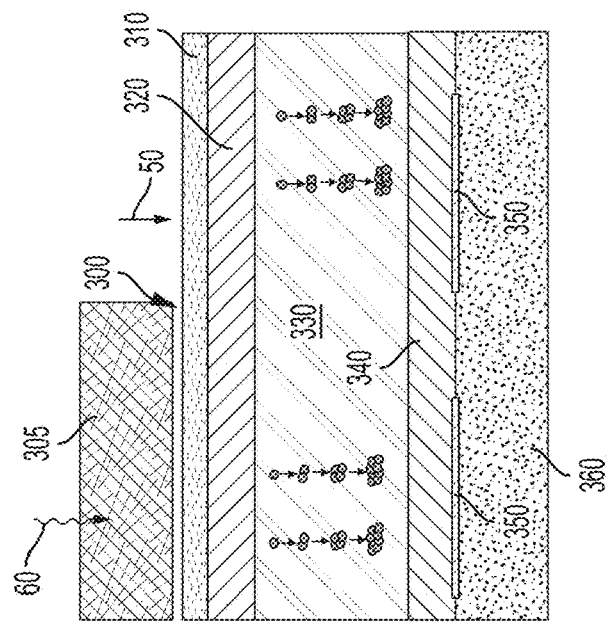
FIG. 1A is a schematic diagram of an optical sensor including a layer of amorphous selenium.

Reference will now be made in greater detail to various embodiments of the subject matter of the present application, some embodiments of which are illustrated in the accompanying drawings. The same reference numerals will be used throughout the drawings to refer to the same or similar parts.

Figure 1B:
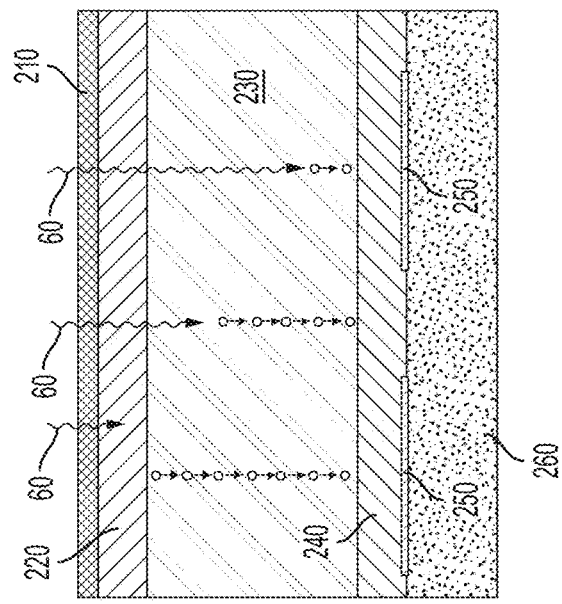
FIG. 1B is a schematic diagram of a direct x-ray sensor that includes an active layer of amorphous selenium.
Figure 1C:
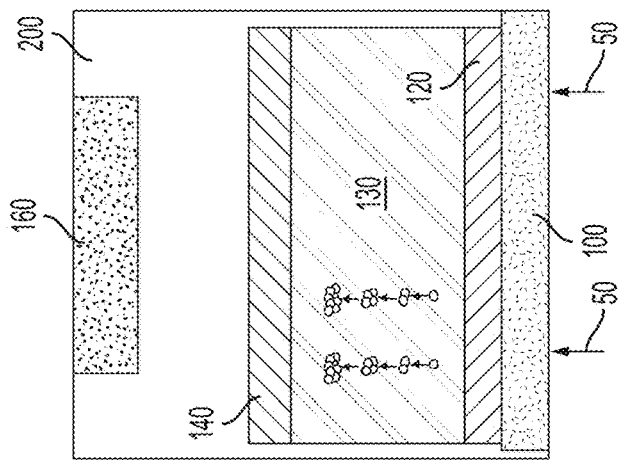
FIG. 1C is a schematic diagram of a combination solid state active matrix flat panel imager (AMFPI) and optical imager that include a layer of amorphous selenium.

Schematic diagrams of an example optical sensor, direct x-ray detector, and indirect x-ray detector are shown in FIG. 1A, FIG. 1B and FIG. 1C, respectively.

Referring to FIG. 1A, an optical sensor includes a transparent substrate 100 such as an electroded glass substrate. The high voltage electrode (not separately shown) can be formed on the substrate from a suitable transparent, conductive material such as indium tin oxide (ITO) using conventional deposition and patterning techniques such as physical vapor deposition (e.g., evaporation or sputtering) and photolithography.

A first charge blocking layer 120 is formed over the substrate 100. First charge blocking layer 120 may be a high temperature, high field hole blocking layer formed from an organic polymer, for example. First charge blocking layer 120 may be formed using a thermal or chemical deposition process.

Referring still to FIG. 1A, a layer of amorphous selenium (a-Se) 130 is disposed over the first charge blocking layer 120. In the various embodiments disclosed herein, a layer of amorphous selenium may have a thickness of 0.5 to 100 microns, e.g., 0.5, 1, 2, 4, 8, 10, 20, 50 or 100 microns, including ranges between any of the foregoing values.

The amorphous selenium may be doped (stabilized) or un-doped. Example dopants include arsenic, tellurium and chlorine, which may be included in amounts of 0.1 to 0.5 atomic percent, e.g., 0.1, 0.2, 0.3, 0.4 or 0.5 at. %, including ranges between any of the foregoing values.

A second charge blocking layer 140 is formed over the layer of amorphous selenium 130. In a comparative structure, second charge blocking layer 140 may be a low temperature, high field electron blocking layer formed from an organic polymer, for example. Second charge blocking layer 140 may be formed using a thermal or chemical deposition process. As will be appreciated, a low temperature process for forming the second charge blocking layer 140 directly over the layer of amorphous selenium (a-Se) 130 may be used to avoid crystallization of the underlying selenium layer 130. In the present context, "low temperature" means a process temperature less than a crystallization onset temperature for selenium, e.g., less than 80° C. or less than 60° C.

In the illustrated embodiment, a space 200 such as an air gap or vacuum gap separates the multi-layer structure including substrate 100, first charge blocking layer 120, a-Se layer 130, and second charge blocking layer 140 from readout electronics 160. Readout electronics 160 may include an electron beam readout. Insomuch as the optical avalanche structure of FIG. 1A relies on a vacuum tube design, the direct conversion sensor cannot operate above an ESe of about 10 V/um. The optical sensor of FIG. 1A is adapted to receive optical radiation 50 through transparent substrate 100. When the a-Se is capable of avalanche gain, the structure is referred to as High Gain Avalanche Rushing Photoconductor (HARP).

Referring to FIG. 1B, shown schematically is an exemplary direct x-ray sensor. The direct x-ray sensor includes a layer of amorphous selenium 230 disposed between a first charge blocking layer 240 and a second charge blocking layer 220. First charge blocking layer 240 may be a high temperature, low field electron blocking layer, while in a conventional structure, second charge blocking layer 220 may be a low temperature, low field hole blocking layer. That is, for thermal compatibility with an already-formed layer of amorphous selenium 230, the second charge blocking layer 220 may be formed at a low temperature, i.e., less than a crystallization onset temperature for amorphous selenium.

Pixel electrodes 250 may be disposed proximate to readout electronics 260. During operation, ionizing radiation such as x-ray radiation 60 may enter the x-ray sensor of FIG. 1B through a transparent, high-voltage (HV) electrode 210. HV electrode 210 may include a patterned layer of ITO, for example.

Referring to FIG. 1C, shown is a scintillating HARP-AMFPI (left) and optical imager (right). Each sensor includes, from bottom to top, readout electronics 360, one or more pixel electrodes 350, an electron blocking layer (EBL) 340, a layer of amorphous selenium 330, a hole blocking layer (HBL) 320, and a high voltage electrode 310. During use, optical radiation 50 may enter the optical imager through the HV electrode 310.

In the illustrated structure, the scintillating HARP-AMFPI sensor additionally includes a scintillator 305 disposed over the HV electrode 310. During use, ionizing radiation 60 may enter the scintillating HARP-AMFPI sensor through the scintillator 305.

In certain structures, an air gap 300 between the scintillator 305 and the a-Se layer 330 may lead to spatial blurring and image degradation. The scintillating HARP-AMFPI shown in FIG. 1C, when formed with a low temperature (i.e., defect-containing) HBL 320 may exhibit inferior performance, such as breakdown during operation.

As will be appreciated, a challenge facing developers of optical and x-ray detectors, such as those described with reference to FIGS. 1A-1C, and including solid-state active matrix flat panel imagers (AMFPI) utilizing an avalanche a-Se sensor, relates to the potential for a processing incompatibility between the amorphous selenium layer and the dielectric layer(s) (i.e., charge blocking layers) used to isolate the a-Se and inhibit charge injection, i.e., dark current injection, from adjacent electrodes during operation.

A difficulty lies in creating a multi-layer structure that can withstand the high ESe and limit dark current injection from the electrodes. A typical detector structure, regardless of application geometry or ESe requirements, includes an n-type, hole blocking layer (HBL) and a p-type, electron blocking layer (EBL) to isolate the a-Se from the positive high voltage (HV) and negatively biased electrodes, respectively, to prevent charge injection.

Desired materials for the charge blocking layers include semiconducting oxides and polymers. Exemplary oxide layers (e.g., silicon dioxide) are typically formed via physical vapor deposition (PVD) or chemical vapor deposition (CVD) at a substrate temperature of at least 200° C. Polymer layers, on the other hand, may be deposited by solution-based processing, but typically require an annealing step at elevated temperatures (e.g., greater than 60° C.) to remove solvent and cross-link the polymer.

During the fabrication of the comparative detectors shown in FIGS. 1A-1C, a charge blocking layer formed over a layer of a-Se must be deposited at substrate temperature less than the crystallization onset temperature for amorphous selenium (i.e., about 60° C.) in order to avoid the formation polycrystalline aggregates within the amorphous selenium.

As will be appreciated, semiconducting oxides and polymers that are formed using sub-optimal conditions (i.e., deposition or curing temperatures of less than about 200° C.) result in poor stoichiometry and the incorporation of defects into the charge blocking layer that may negatively impact performance or even cause failure, particularly at high ESe. Thus, the performance of the sensors depicted in FIGS. 1A-1C may be limited by the deposition temperature of the top charge blocking layer.

According to various embodiments, the fabrication of a multi-layer sensor architecture, including a layer of amorphous selenium, includes the formation of a first portion of the amorphous selenium layer over a previously-formed first charge blocking layer, i.e., an electron blocking layer (EBL), and the formation of a second portion of the amorphous selenium layer over a previously-formed second charge blocking layer, i.e., a hole blocking layer (HBL). The disclosed process delays the formation of the first and second portions of the (temperature sensitive) amorphous selenium layer until after formation of the respective charge blocking layers. In certain embodiments, the charge blocking layers are formed on separate substrates. This allows the EBL and HBL deposition processes to be conducted at a relatively high temperature without adversely affecting the layer(s) amorphous selenium. An example process can be understood with reference to FIGS. 2A-2C.

Referring to FIG. 2A, the fabrication process flow for a fused selenium sensor according to various embodiments includes the formation of an electron blocking layer (EBL) 440 over a first substrate 460. The first substrate 460 may include an electronic readout such as a thin film transistor, CMOS transistor or photon counting sensor. A pixel electrode or a pixel electrode array 450 may be disposed over the first substrate 460, e.g., between the first substrate 460 and the EBL 440. A first doped or un-doped layer of amorphous selenium 431 having a first thickness (T1) is deposited over the EBL 440.

Separately, referring to FIG. 2B, a hole blocking layer (HBL) 420 is formed over a second substrate 405. The second substrate 405 may include any substrate suited for the desired application, including a scintillator, fiber optic faceplate, glass, or glass carrier for a de-bonded clear thin polymer. The second substrate 405 may be an electroded substrate, including a high voltage (HV) electrode 410. The HV electrode may include indium tin oxide, for example. A second doped or un-doped layer of amorphous selenium 432 having a second thickness (T2) is then deposited over the HBL 420.

In certain embodiments, the first layer of amorphous selenium 431 and the second layer of amorphous selenium 432 may each be doped. In certain embodiments, the first layer of amorphous selenium 431 and the second layer of amorphous selenium 432 may each be un-doped.

Referring to FIG. 2C, in a further step, the first layer of amorphous selenium 431 is brought into contact with the second layer of amorphous selenium 432 to form a multi-layer structure 400, which is heated at a temperature sufficient to fuse the first layer of amorphous selenium to the second layer of amorphous selenium. Fusion may be accomplished by heating to above the glass transition temperature ($T_g$) of amorphous selenium, but below its crystallization temperature ($T_c$). The fusion temperature will be determined by the glass transition temperature, which is dependent on the extent of doping of the amorphous selenium layer(s). In certain embodiments, fusion of the first and second layers of amorphous selenium may be accompanied by the application of a compressive force. In certain embodiments, the fusion may be performed in air or under vacuum, e.g., if air cavities inhibit uniform fusion.

Above its glass transition temperature, a-Se becomes a viscos, rubber like adhesive allowing for two layers of selenium to be fused together. The soft and flexible state will planarize and remove surface topology in the a-Se, which may result from deposition imperfections or substrate topology. By fusing the first and second layers of amorphous selenium at a temperature less than the recrystallization temperature of selenium, the resulting composite (multi-layer) structure 431, 432, which has a total thickness T=T1+T2, may be free of any crystalline phase(s).

In certain embodiments, one or both substrates may be a flexible substrate. Flexible substrates such as thin glass, phosphor screens and Mylar films may induce less stress on the a-Se, resulting in more uniform fusion over a large area compared to inflexible glass substrates, for example.

Applicant has shown that unequal charge transport of holes and electrons across the fusion interface can be advantageous to device performance. Although T1 is equal to T2 in the illustrated embodiment of FIG. 2C, the respective thicknesses of the first and second layers of amorphous selenium can be varied such that the fusion interface is closer to one of the blocking layers, which can improve by blocking property of that blocking layer.

For instance, according to various embodiments, time of flight (TOF) measurements for a single pixel sensor measuring about 2 cm×2 cm demonstrate that holes, which are the primary charge carrier in a-Se, move across the fusion interface. In such case, if electron transport across the fusion interface is significantly worse than holes, the thicknesses of the respective a-Se layers can be selected such that T2 is greater than T1, whereby poor transport across the fusion interface can contribute to electron blocking. The thickness of T1 may be decreased so long as the substrate topology is planarized and uniform fusion can be achieved.

Figure 3C:
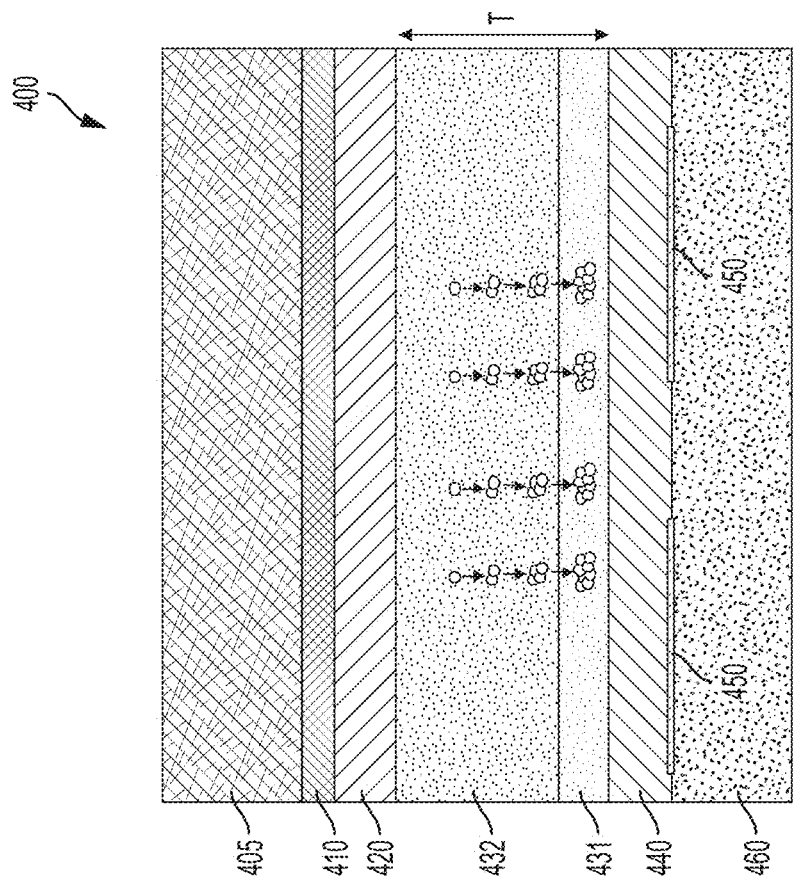
FIG. 3C shows the formation of a multi-layer structure by the alignment and subsequent fusion of first and second layers of amorphous selenium according to certain embodiments.
Figure 3A:
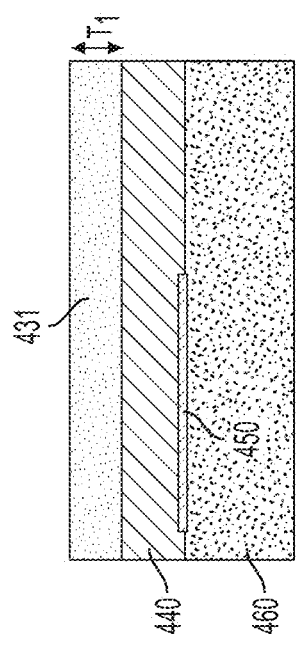
FIG. 3A illustrates the sequential formation of a charge blocking layer and a first layer of amorphous selenium having a first thickness over a substrate including an electronic readout.
Figure 3B:
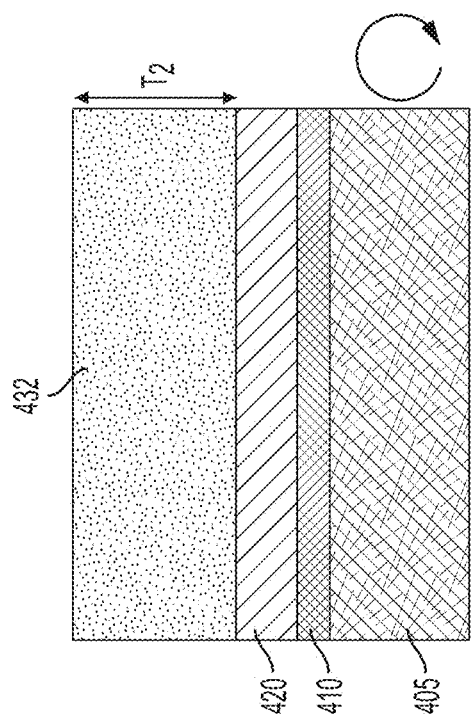
FIG. 3B illustrates the formation of a charge blocking layer and a second layer of amorphous selenium having a second thickness different from the first thickness over a substrate.

Thus, referring to FIGS. 3A-3C, according to further embodiments, a first layer of amorphous selenium 431 has a thickness T1, while a second layer of amorphous selenium 432 has a thickness T2, where T1 is less than T2. In an example structure formed by the fusion of two separate layers of amorphous selenium, the thickness (T1) of one layer may be 5 to 200% of the thickness (T2) of the other layer, e.g., 5, 10, 20, 50, 100, 150 or 200%, including ranges between any of the foregoing values. For instance, a first layer of amorphous selenium and a second layer of amorphous selenium may each have a thickness of 5.4 microns. In a further example, a first layer of amorphous selenium may have a thickness of 10 microns and a second layer of amorphous selenium may have a thickness of 5 microns.

A further method of fabricating a multi-layer sensor includes forming a charge blocking layer over a substrate, forming a layer of amorphous selenium over the previously-deposited charge blocking layer, and heating the layer of amorphous selenium to fuse the layer of amorphous selenium to the charge blocking layer.

Figure 4B:
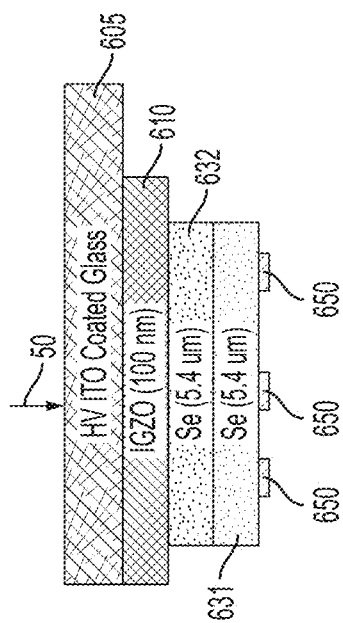
FIG. 4B shows a further example sensor structure formed by the lamination and fusion of separately-formed layers of amorphous selenium.
Figure 4A:
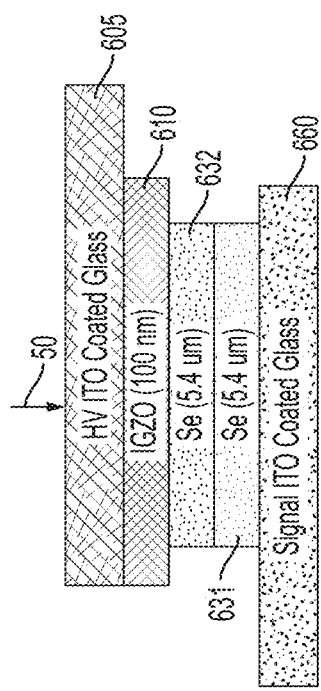
FIG. 4A shows an example sensor structure formed by the lamination and fusion of separately-formed layers of amorphous selenium.

Referring to FIG. 4A and FIG. 4B, shown are exemplary sensor architectures that may be formed by the fusion of separately deposited (i.e., top and bottom) layers of amorphous selenium. The architecture in FIG. 4A includes an electroded (e.g., indium tin oxide coated) glass substrate 660 and an over-formed first layer of amorphous selenium 631 that has been fused to a high voltage ITO coated glass substrate 605 via an indium gallium zinc oxide (IGZO) layer 610, and an over-formed second layer of amorphous selenium 632. After forming the foregoing structure, one of the substrates 605, 660 may be removed (e.g., delaminate) if desired. An analogous structure, referring to FIG. 4B, includes poly(3,4-ethylenedioxythiophene) (PEDOT) electrodes 650 formed over a surface of the first layer of amorphous selenium 631.

Figure 5:
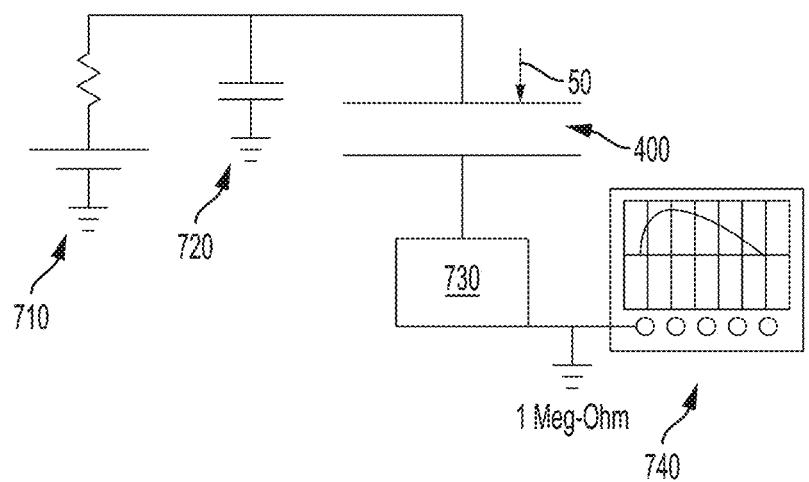
FIG. 5 depicts an experimental set-up used to evaluate the disclosed multi-layer sensors.

A measurement system 700 for evaluating a multi-layer sensor is shown schematically in FIG. 5. The measurement system 700 includes a power supply 710, high voltage filter 720, current amplifier 730 and oscilloscope 740. An example current amplifier 730 is a Stanford SR 570 amplifier. A multi-layer sensor 400 may be mounted between the power supply 710 and the oscilloscope 740, and irradiated with a source of optical radiation (e.g., 500 ps, 500 nJ laser pulses).

Figure 6:
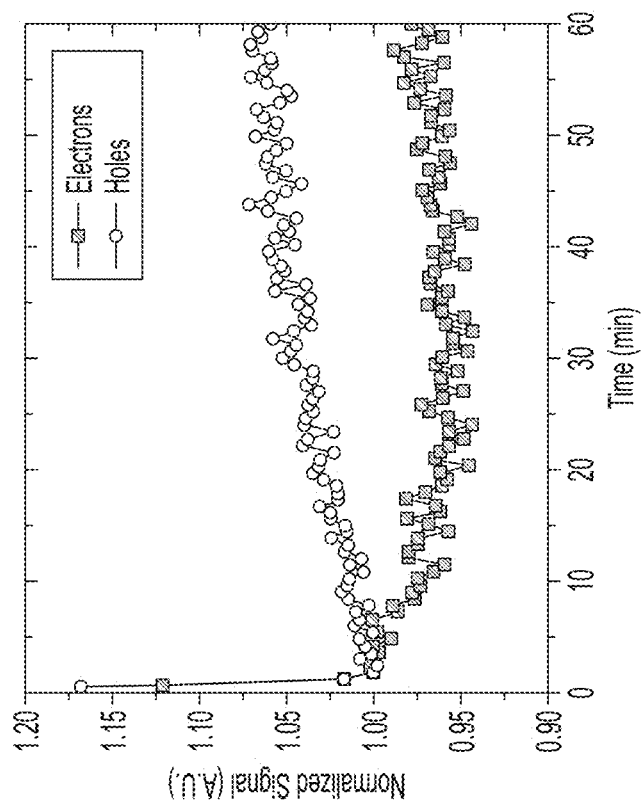
FIG. 6 is a plot of time of flight versus electric field for an example multi-layer sensor.
Figure 7:
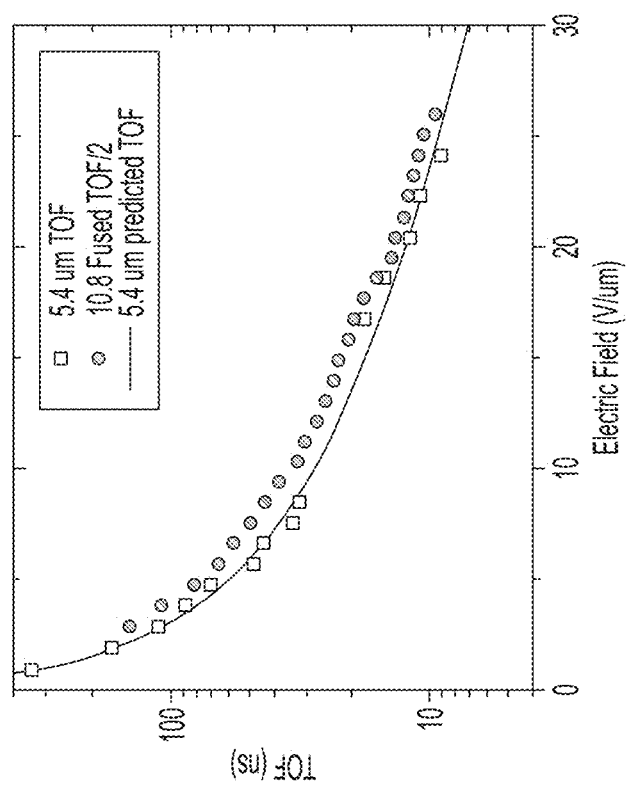
FIG. 7 is a plot of normalized signal versus time demonstrating minimal ghosting for an exemplary multi-layer sensor.

FIG. 6 is a plot of hole time-of-flight (TOF) versus electric field for an example multi-layer sensor confirming that charge traverses the fused interface between first and second layers of amorphous selenium. FIG. 7 is a plot of normalized signal versus time for an exemplary multi-layer sensor under continuous 30 Hz excitation at 30V (~5 V/micron) demonstrating negligible ghosting, which is a measure of the drop in x-ray sensitivity of the exposed region of the sensor.

According to various embodiments, by depositing the charge blocking layer(s) prior to depositing amorphous selenium, the charge blocking layer(s) as well as readout electronics can be fabricated at elevated temperatures. Such processing is not limited by the crystallization temperature of a-Se, resulting in the formation of efficient charge blocking layers, which enables improved signal amplification.

The disclosed methods can be used to form solid state sensors, which are more reliable than vacuum tube-based sensors. Moreover, such sensors can be fabricated using existing materials and materials deposition technologies. In certain embodiments, unequal charge transport across the interface between the fused first and second amorphous selenium layers can be advantageous if the interface is located proximate to the blocking layer for the slower charge carrier.

As used herein, the singular forms "a," "an" and "the" include plural referents unless the context clearly dictates otherwise. Thus, for example, reference to a "photoconductor layer" includes examples having two or more such "photoconductor layers" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a photoconductor layer that comprises amorphous selenium include embodiments where a photoconductor layer consists essentially of amorphous selenium and embodiments where a photoconductor layer consists of amorphous selenium.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of fabricating a sensor, comprising:
    forming a first charge blocking layer over a first substrate;
    forming a first layer of amorphous selenium over the first charge blocking layer; and
    heating the first layer of amorphous selenium to fuse the first layer of amorphous selenium to the first charge blocking layer.

2. The method of claim 1, wherein the first substrate is a flexible substrate.

3. The method of claim 1, wherein the first charge blocking layer is formed by physical vapor deposition or chemical vapor deposition at a temperature of at least 200° C.

4. The method of claim 1, wherein the first layer of amorphous selenium is heated to a temperature between 35° C. and 60° C. to fuse the layer of amorphous selenium to the first charge blocking layer.

5. The method of claim 1, further comprising:
    forming a second charge blocking layer over a second substrate;
    forming a second layer of amorphous selenium over the second charge blocking layer; and
    forming a multi-layer structure by contacting the first layer of amorphous selenium and the second layer of amorphous selenium, wherein the first layer of amorphous selenium is fused to the second layer of amorphous selenium.

6. The method of claim 5, wherein the first charge blocking layer and the second charge blocking layer each comprise an organic polymer.

7. The method of claim 5, wherein the first charge blocking layer and the second charge blocking layer are formed by physical vapor deposition, chemical vapor deposition or solution-based deposition.

8. The method of claim 1, wherein the first substrate comprises an electronic readout.

9. The method of claim 1, wherein the first charge blocking layer is formed over a pixel electrode.

10. The method of claim 5, wherein a thickness of the first layer of amorphous selenium is less than a thickness of the second layer of amorphous selenium.

11. The method of claim 5, wherein at least one of the first layer of amorphous selenium and the second layer of amorphous selenium comprises doped amorphous selenium.

12. The method of claim 5, wherein the second substrate comprises electroded glass or a scintillator.

13. The method of claim 5, wherein at least one of the first substrate and the second substrate is a flexible substrate.

14. The method of claim 5, further comprising forming a high voltage electrode over the second substrate.

15. The method of claim 1, wherein the multi-layer structure is free of pores.

16. The method of claim 1, wherein the first layer of amorphous selenium is of a thickness between 0.5 microns and 100 microns.

17. The method of claim 1, wherein the first layer of amorphous selenium comprises a dopant selected from the group consisting of arsenic, tellurium and chlorine.

18. The sensor of claim 17, wherein the dopant is included in amount of 0.1 atomic percent to 0.5 atomic percent.

19. The method of claim 5, wherein a thickness of the first layer of amorphous selenium is within 5% to 200% of a thickness of the second layer of amorphous selenium.

* * * * *